(12) United States Patent
Tokuhara et al.

(10) Patent No.: US 6,751,858 B2
(45) Date of Patent: Jun. 22, 2004

(54) METHOD FOR MANUFACTURING SENSOR APPARATUS

(75) Inventors: Minoru Tokuhara, Okazaki (JP); Yukihiro Kato, Kariya (JP)

(73) Assignee: Denso Corporation, Kariya (JP)

( * ) Notice: Subject to any disclaimer, the term of this patent is extended or adjusted under 35 U.S.C. 154(b) by 170 days.

(21) Appl. No.: 09/922,801

(22) Filed: Aug. 7, 2001

(65) Prior Publication Data

US 2002/0050052 A1 May 2, 2002

(30) Foreign Application Priority Data

Sep. 18, 2000 (JP) ........................................ 2000-282256

(51) Int. Cl.⁷ ................................................ H05K 3/30
(52) U.S. Cl. ............................ 29/841; 29/832; 29/595; 29/855; 438/5; 438/118; 438/127
(58) Field of Search .......................... 29/840, 841, 895, 29/848, 856, 855, 832; 250/353, 338.4, 338.1; 438/5, 118, 127

(56) References Cited

U.S. PATENT DOCUMENTS 4,338,149 A * 7/1982 Quaschner ................... 156/248
6,093,576 A * 7/2000 Otani ............................ 438/5

FOREIGN PATENT DOCUMENTS

JP    A-4-106439    4/1992

\* cited by examiner

*Primary Examiner*—Richard Chang
(74) *Attorney, Agent, or Firm*—Posz & Bethards, PLC

(57) ABSTRACT

In a method for manufacturing a sensor apparatus having a sensor chip disposed in a recess of a case, after the sensor chip is disposed in the recess of the case, an opening portion of the recess is closed with a sheet member. The sheet member can prevent foreign matters from intruding an inside of the recess during manufacturing steps. After that, a through hole is formed in the sheet member. Accordingly, the inside and outside of the recess communicate with each other, and the sensor chip can detect an external environment of the recess such as atmospheric pressure.

18 Claims, 5 Drawing Sheets

METHOD FOR MANUFACTURING SENSOR APPARATUS

CROSS REFERENCE TO RELATED APPLICATION

This application is based upon and claims the benefit of Japanese Patent Applications No. 2000-282256 filed on Sep. 18, 2000, the contents of which are incorporated herein by reference.

BACKGROUND OF THE INVENTION

1. Field of the Invention

This invention relates to a method for manufacturing a sensor apparatus including a sensor element that is disposed in a recess formed in a case for measuring an external environment of the recess.

2. Description of the Related Art

An atmospheric pressure sensor for detecting an atmospheric pressure is known as this kind of sensor apparatus. FIG. 1 shows a structure of an atmospheric pressure sensor J1. In the sensor J1, leads are insert-molded in a case 1, and a recess 2 is formed in the case 1. A sensor chip is disposed in the recess 2 as a pressure detecting element for detecting an atmospheric pressure outside the recess 2. The sensor chip 3 is electrically connected to the leads 6 through wires 7.

Gel 8 is disposed on the surface of the sensor chip 3 for protecting the sensor chip 3. A lid 200 is bonded to the case 1 by adhesive or the like to close the opening portion of the recess 2. The lid 200 has a hole 201 through which inside and outside of the recess 2 communicate with each other, and the atmosphere is introduced into the recess 2 through the hole 201 so that the sensor chip 3 detects the atmospheric pressure. The atmospheric pressure sensor J1 is attached to a member (not shown) such as a printed board, and the leads 6 are electrically connected to the member, thereby constituting a sensor apparatus.

Next, a method for manufacturing the sensor apparatus is explained referring to FIGS. 2A to 2D and 3A to 3C.

First, as shown in FIG. 2A, the atmospheric pressure sensor J1 shown in FIG. 1 is prepared, and as shown in FIG.2B, a masking tape 202 is adhered to the lid 200. Then, referring to FIG. 2C, the sensor J1 is mounted on a printed board 20 through cream solder 21. As shown in FIG. 2D, the solder 21 is reflowed by hot air (as indicated by arrows Y1 in FIG. 2D), so that the leads 6 are electrically connected to the printed board 20, and the atmospheric pressure sensor J1 and the printed board 20 are integrally bonded to each other.

After that, referring to FIG. 3A, the integrated sensor J1 and the board 20 are immersed into washing solution 22 to remove solder flux, and then are dried. Next, damp proof agent is applied to the entire surface of the atmospheric pressure sensor J1 and the printed board 20 by, for example, splaying it in a direction indicated by arrows Y1 in FIG. 3B.

After the damp proof agent is dried, the masking tape 202 is peeled off as shown in FIG. 3C. Thus, the sensor apparatus having the atmospheric pressure sensor J1 mounted on the printed board 20 is completed. The sensor apparatus is shipped after undergoing various tests. The sensor apparatus is installed in, for example, a vehicle ECU as an atmospheric pressure sensor for adjusting atmospheric pressure in a system such as an automotive EFI (Electronic Fuel Injection system).

Here, the reason why the masking tape 202 is used in the above-described method is as follows.

If the washing solution 22 intrudes the recess 2 through the hole 201 of the lid 200 without the masking tape 202, the washing solution 22 may adversely affect sensor characteristics by swelling not only the gel 8 for protecting the sensor chip 3 but also the adhesive 5 adhering the sensor chip 3 to the case 3.

Likewise when the damp proof agent intrude the recess 2, the gel 8 and the adhesive 5 maybe swelled due to a diluted component of the damp proof agent, and the wires 7 may be broken due to stress produced when the damp proof agent is hardened. Thus, the intruding damp proof agent would adversely affect the sensor characteristics and the structure. Therefore, the masking tape 202 is used to prevent the washing solution 22, the damp proof agent and other foreign matters from intruding the recess 2. However, because the masking tape 202 must be detached after the damp proof agent is dried, the number of manufacturing steps is increased.

SUMMARY OF THE INVENTION

The present invention has been made in view of the above problems. An object of the present invention is to provide a simplified method for manufacturing a sensor apparatus including a sensor element disposed in a recess of a case for detecting an external environment of the recess.

According to the present invention, in a method for manufacturing a sensor apparatus, after a sensor element is disposed in a recess of a case, an opening portion of the recess is closed with a sheet member. After that, a through hole is formed in the sheet member so that an inside and an outside of the recess communicate with each other through the through hole.

Accordingly, when washing or application of damp proof agent is performed after the opening portion of the recess is closed with the sheet member and before the through hole is formed in the sheet member, the sheet member can prevent foreign matters from intruding inside the recess. The sheet member needs not be detached after such treatment. As a result, the method for manufacturing the sensor apparatus is simplified.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

Figure 1:
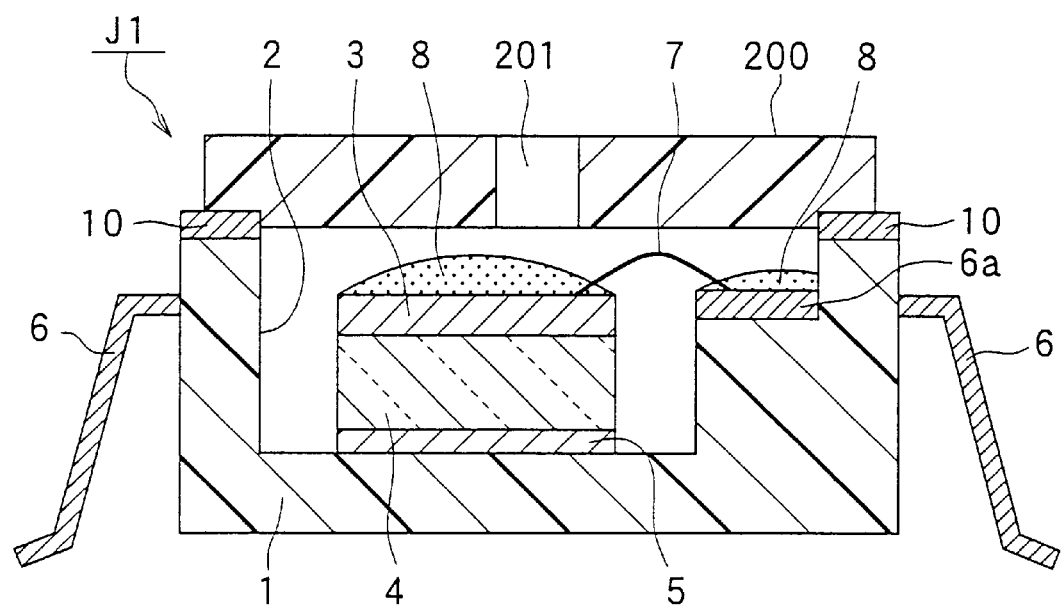
FIG. 1 is a cross-sectional view showing an atmospheric pressure sensor for a sensor apparatus according to a related art.
Figure 2A:
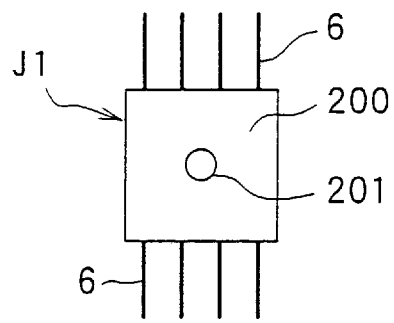
FIGS. 2A to 2D and 3A to 3C are cross-sectional views showing a method in a stepwise manner for manufacturing the sensor apparatus adopting the atmospheric pressure sensor shown in FIG. 1.
Figure 2B:
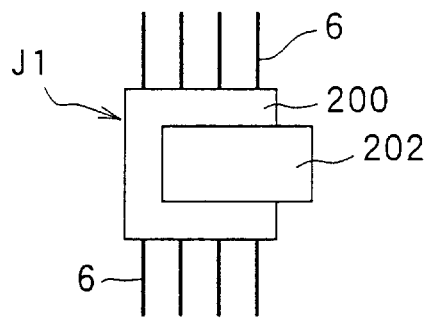
Figure 2C:
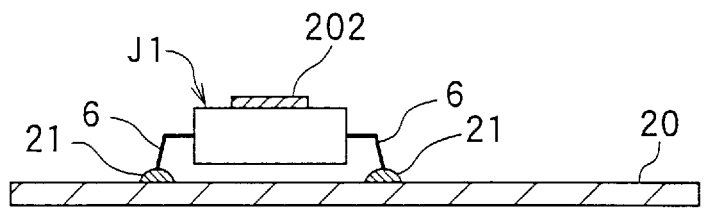
Figure 2D:
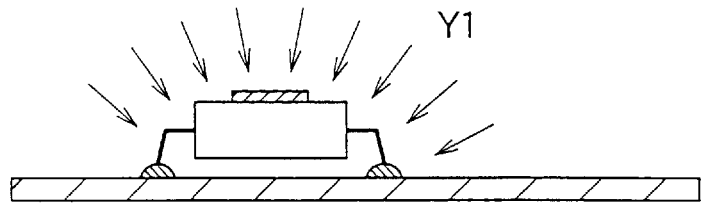
Figure 4:
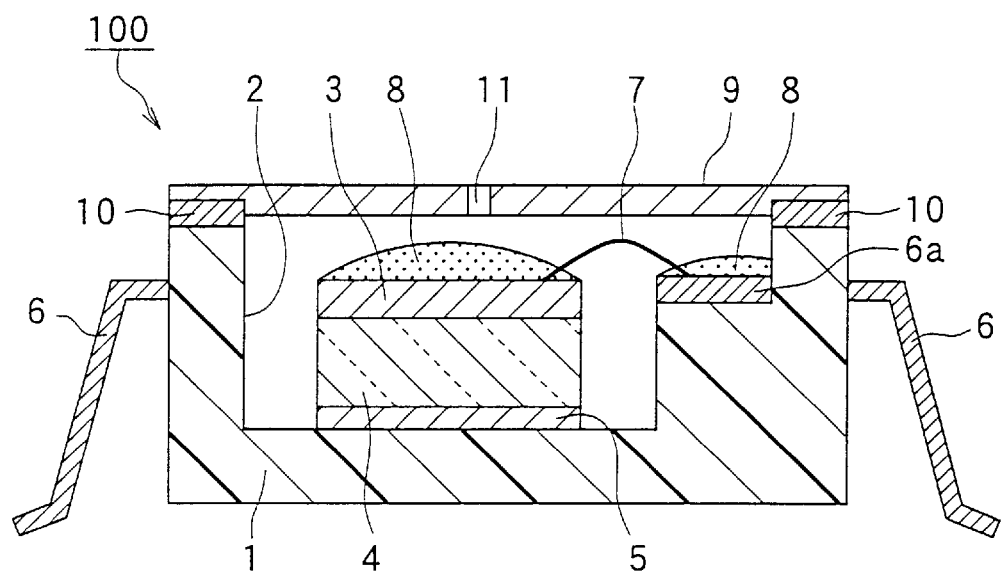
FIG. 4 is a cross-sectional view showing an atmospheric pressure sensor for a sensor apparatus according to a preferred embodiment of the present invention.

A preferred embodiment of the present invention is explained below. FIG. 4 shows a structure of an atmospheric pressure sensor 100 in the present invention, which modifies the atmospheric pressure J1 shown in FIG. 1, and the same parts as those shown in FIG. 1 are designated with the same reference numerals.

Figure 3A:
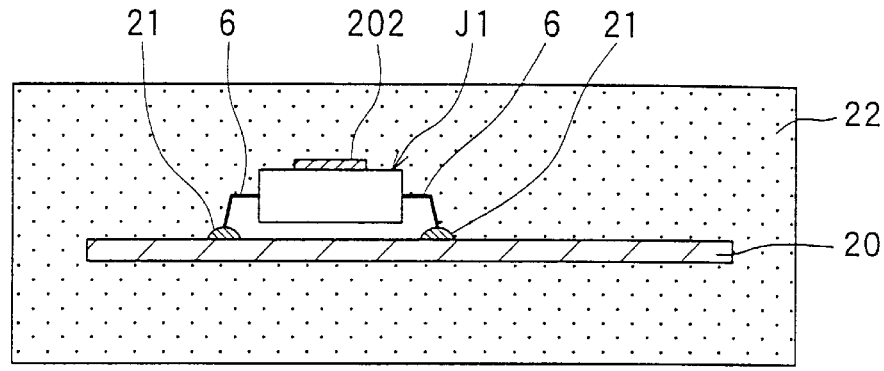
Figure 3B:
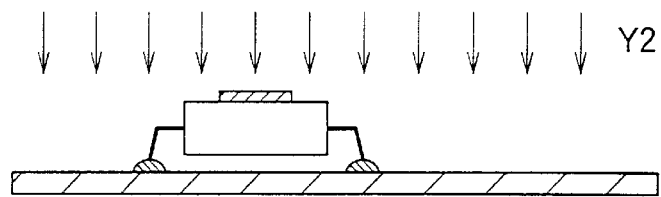
Figure 3C:
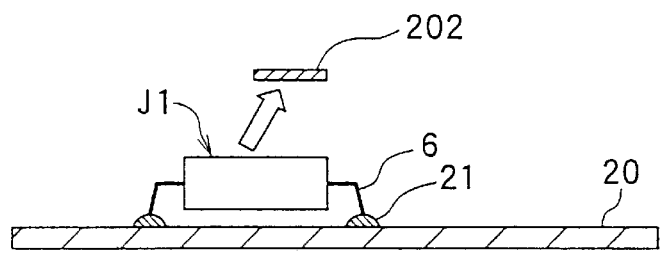

The atmospheric pressure sensor 100 is, for example, installed in a vehicle ECU for adjusting an atmospheric pressure in a system such as an automotive EFI or the like. Although it is not shown, in practice, the atmospheric pressure sensor 100 is attached to a printed board 20 within the ECU similarly to the sensor J1 as shown in FIG. 3C, thereby constituting a sensor apparatus.

In FIG. 4, a case 1 is molded from resin such as PPS (polyphenyl sulfide) or PBT (polybutylene terephthalate), and has a recess 2 that is recessed from an outer surface of the case 1. A sensor chip 3 is disposed in the recess 2 as a sensor element for measuring an atmospheric pressure at an outside of the recess 2. The senor chip 3 can convert a pressure applied thereto into an electric signal and output the electric signal. Specifically, a pressure sensor element can be used as the sensor chip 3, which is made of semiconductor such as silicon and has a diaphragm. In the present embodiment, the sensor chip 3 is integrally bonded to a glass base 4, and the base 4 is bonded to the bottom face of the recess 2 through adhesive 5.

Conductive leads 6 made of copper based alloy or the like are insert-molded in the case 1. The leads 6 have projecting portions 6a projecting inside the recess 2. The projecting portions 6a are electrically connected to the sensor chip 3 through wires 7 made of gold, aluminum, or the like. The leads 6 also protrude outside the case 1 to be connectable to the printed board 20 described above. Thus, the output form the sensor chip 3 can be outputted to the printed board 20 through the wires 7 and the leads 6.

Gel (protective resin member) 8 for protecting the sensor chip is disposed on the surface of the sensor chip 3 and on the connecting portions between the wires 7 and the leads 6. The gel 8 exhibits damp proof on the surface of the sensor chip 3 and on the connecting portions.

A sheet member 9 is adhered to the case 1 through adhesive 10 to close the opening portion of the recess 2. The sheet member 9 has a through hole 11 through which the inside and the outside of the recess 2 communicate with each other. The through hole 11 works as an atmosphere releasing hole, and the inside of the recess 2 can have the same pressure as the external atmospheric pressure through this through hole 11. The sheet member 9 is made of heat resisting resin material such as polyimide.

Next, a method for manufacturing the sensor apparatus having the above structure is explained. First, the sensor chip 3 is disposed in the recess 2 of the case 1 (sensor element setting step). Specifically, the case 1 formed with the recess 2 and holding the leads 6 insert-molded therein is prepared. Then, the sensor chip 3 integrated with the base 4 is fixed inside the recess 2 through the adhesive 5.

Next, the sensor chip 3 is electrically connected to the leads 6 through the wires 7 by wire bonding. The gel 8 is applied to and set on the surface of the sensor chip 3 and on the connecting portions between the wires 7 and the leads 6. Next, the sheet member 9 closes the opening portion of the recess 2 to cover the sensor chip 3 (sheet member attachment step). Specifically, the adhesive 10 is applied to the peripheral portion of the sheet member 9 or the opening edge portion of the recess 2, and the sheet member 9 is fixedly adhered to the case 1 through the adhesive 10 so that it closes the opening portion of the recess 2.

After that, steps substantially the same as those shown in FIGS. 2C to 3B are carried out. Here, it should be noted that the steps in the present embodiment are carried out with the sheet member 9 having no hole and without the masking tape 202.

Specifically, the atmospheric pressure sensor 100 is mounted on the printed board 20 through cream solder 21 (referring to FIG. 2C), and the solder 21 is reflowed by hot air. Thus, the leads 6 are electrically connected to the printed board 20 (referring to FIG. 2D). When the case 1 is made of PBT, this connection may be performed by light-beam, local heating, iron-soldering, or the like.

Next, the sensor 100 and the printed board 20 integrated together are washed in the washing solution 22 (referring to FIG. 3A), and are dried. After that, damp proof agent is applied to the entire surface of the atmospheric pressure sensor 100 and the printed board 20 (referring to FIG. 3B).

After the damp proof agent is dried, in the present embodiment, the through hole 11 is formed in the sheet member 9 so that the inside and the outside of the recess 2 communicate with each other (through-hole formation step). Specifically, a sharp-edged blade tool such as a drill penetrates the sheet member 9 to form the through hole 11. Otherwise, a laser or a heated iron may be brought in contact a part of the sheet member 9 to melt the part and to form the through hole 11. As a result, the sensor apparatus in which the atmospheric pressure sensor 100 having the through hole 11 is mounted on the printed board 20 is completed. The sensor apparatus is shipped after undergoing various tests.

In the sensor apparatus described above, atmospheric pressure is introduced into the recess 2 through the through hole 11 in the atmospheric pressure sensor 100, and the sensor chip 3 receives the atmospheric pressure and outputs an electric signal in accordance with the pressure. The signal is outputted to the printed board 20 via the wires 7 and the leads 6, and is used in the ECU for adjusting the atmospheric pressure.

According to the method in the present embodiment, the washing step and the application step of the damp proof agent can be performed after the sheet member 9 closes the recess 2 holding the sensor chip 3 therein, and before the through hole 11 is formed in the sheet member 9. The inside and the outside of the recess 2 can communicate with each other by the through hole 11 formed in the sheet member 9.

Thus, according to the present embodiment, the sheet member 9 works as the above-described lid 200, and simultaneously works as the above-described masking tape 202. Therefore, the sheet member 9 is left as an element constituting the sensor apparatus. The sheet member 9 needs not be detached, resulting in simplified process. That is, according to the present embodiment, the manufacturing process can be simplified while preventing foreign matters from intruding the recess 2 during the manufacturing process.

In the present embodiment, although a sheet made of heat resisting resin material such as polyimide is sued as the sheet member 9, other films such as a film made of aluminum (aluminum film) are applicable. In this case, likewise, the through hole 11 can be formed in the sheet member by a sharp-edged blade tool or laser heating.

Figure 5A:
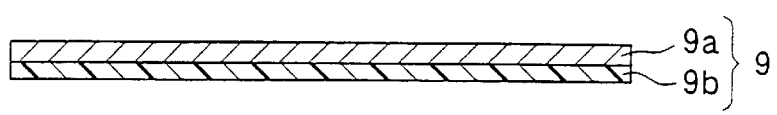
FIGS. 5A to 5C are cross-sectional views showing various constitutions of a sheet member in the embodiment.
Figure 5B:
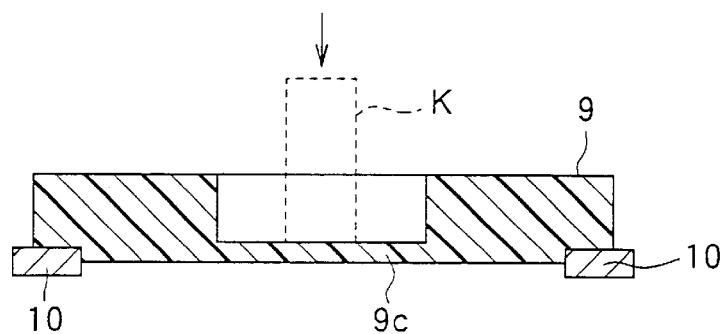
Figure 5C:
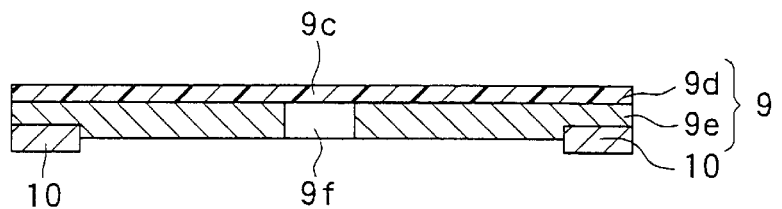

Further, the sheet member 9 can have various constitutions as shown in FIGS. 5A to 5C. For example, the sheet member 9 shown in FIG. 5A has a two-layered structure composed of an aluminum film 9a and a sheet 9b made of thermoplastic resin (for heat-sealing or hot-melting). In this case, the sheet member 9 can be adhered to the case 1 at the sheet 9b. The formation of the through hole 11 is also possible by the above-described blade tool, laser heating, and the like.

The sheet member 9 shown in FIG. 5B is a single-layered sheet having a relatively thick thickness and made of similar material (such as PPS resin) to that of the lid shown in FIG. 1. The sheet 9 has a thin portion 9c where the through hole 9a is to be formed. The thin portion 9c is thinned as compared to the other portion of the sheet member 9. In this case, the through hole 11 can be easily formed in the thin portion 9c of the sheet member 9 as compared to the sheet member that does not have a thin portion. Also, in this case, as illustrated by a broken line in FIG. 5B, the through hole 11 may be formed using a jig K that is pushed against the thin portion 9c to stamp out the thin portion 9c.

The sheet member 9 shown in FIG. 5C has a two-layered structure composed of a first layer 9d and a second layer 9e that form a thin portion 9c. In this case, either one of the layers 9d, 9e (the second layer 9e in FIG. 5C) is formed with a hole 9f where the through hole 11 is to be formed, and the other layer closes the hole 9f, thereby forming the thick portion 9c. That is, the thin portion 9a has a thickness corresponding to the one layer, while the other thick portion has a thickness corresponding to the sum of the two layers in thickness.

Specifically, the second layer 9c having the hole 9f can adopt a metallic plate made of aluminum or the like, a resin sheet made of PPS, or others. The first layer 9d closing the hole 9f can adopt a film made of polyimide that is coated on the second layer 9e. Then, the through hole 11 can be formed in the sheet member 9 by sticking the first layer 9d with the above-described tool, by heating the first layer 9d with laser or other methods.

Figure 6:
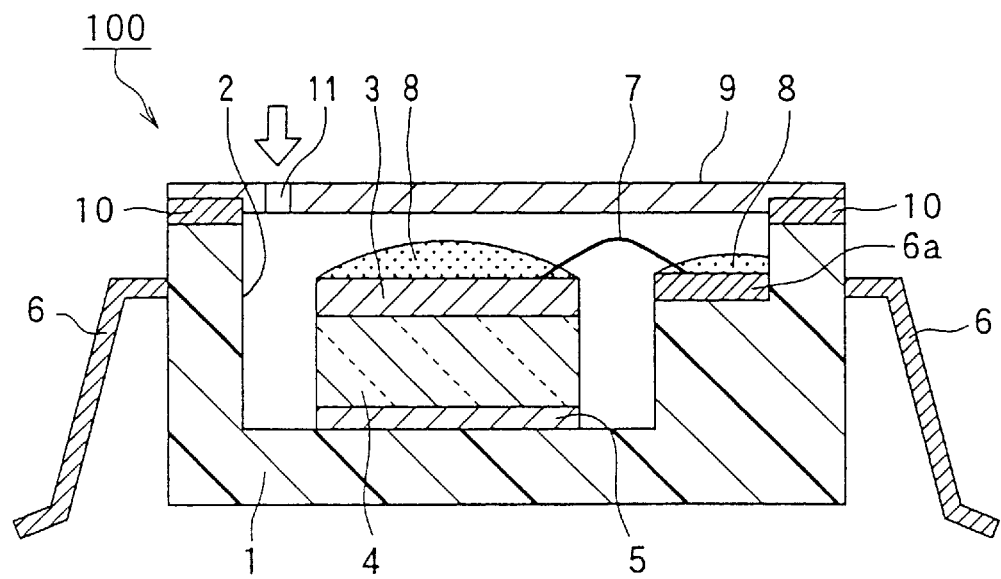
FIG. 6 is a cross-sectional view showing an atmospheric pressure sensor as a modification of the embodiment according to the present invention.

Further, although the through hole 11 is formed in the sheet member 9 to be positioned immediately above the sensor chip 3 in FIG. 4, the position of the through hole 11 is not limited to that. As shown in FIG. 6, the through hole 11 may be formed at a peripheral portion of the sheet member 9. In this case, because the though hole 11 does not face the sensor chip 3, the sensor chip is prevented from being occasionally damaged when the through hole 11 is formed.

Although the present invention is applied to the sensor apparatus having the atmospheric pressure sensor, it is not limited to that but may be applied to various sensor apparatuses provided that the sensor apparatus has a case with a recess and a sensor element disposed in the recess for detecting an external environment of the recess.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a sensor apparatus, comprising:

disposing a sensor element in a recess of a case, the sensor element being for detecting an external environment of the recess;

closing an opening portion of the recess with a sheet member; and penetrating the sheet member to form a through hole in the sheet member so that an inside and an outside of the recess communicate with each other through the through hole after the closing the opening portion of the recess with the sheet member.

2. The method according to claim 1, wherein the through hole is formed in the sheet member by a blade tool.

3. The method according to claim 1, wherein the through hole is formed in the sheet member by heating a part of the sheet member and melting the part.

4. The method according to claim 1, wherein the sheet member is made of resin.

5. The method according to claim 1, wherein:

the sheet member has a thin portion that is thinner than a remaining portion of the sheet member; and the through hole is formed in the thin portion of the sheet member.

6. The method according to claim 1, wherein the sensor element detects an atmospheric pressure at the outside of the recess.

7. The method according to claim 1, further comprising:

attaching the case to a printed board after the recess is closed with the sheet member; and applying a damp proof agent to a surface of the case before the through hole is formed in the sheet member.

8. The method according to claim 1, wherein the penetrating is performed by a drill.

9. The method according to claim 8, wherein the sheet member has a recess, and wherein the through hole is formed in a bottom of the recess.

10. The method according to claim 9, further comprising:

attaching the case to a printed board just after closing the opening portion of the recess with the sheet member; and applying a dump proof agent to a surface of the case before forming the through hole in the sheet member.

11. The method according to claim 10, further comprising coating a gel onto the sensor element in the recess of the case before closing the opening portion of the recess with the sheet member.

12. The method according to claim 11, wherein the sheet member is made of resin, and wherein the recess connects to an outside of the recess through the through hole so that the sensor element detects an atmospheric pressure at the outside of the recess.

13. A method for manufacturing a sensor apparatus, comprising:

disposing a sensor element in a recess of a case;

closing an opening portion of the recess with a sheet member to prevent communication between inside and outside of the recess;

performing a treatment to the case with the sheet member that prevents foreign matters from intruding the inside of the recess during the treatment; and penetrating the sheet member to form a through hole in the sheet member to allow the communication between the inside and the outside of the recess after the closing the opening portion of the recess with the sheet member.

14. The method according to claim 13, wherein the treatment is washing the case using a solution.

15. The method according to claim 13, wherein the treatment is applying a damp proof agent to a surface of the case.

16. The method according to claim 13, wherein the through hole is formed in the sheet member excluding a portion facing the sensor chip.

17. The method according to claim 13, wherein:

the sheet member has a thin portion that is thinner than a remaining portion of the sheet member; and the through hole is formed in the thin portion of the sheet member.

18. The method according to claim 17, wherein:

the sheet member is composed of a first layer having a hole and a second layer laminated with the first layer and closing the hole to form the thin portion; and the through hole is formed in the thin portion consisting of the second layer.

* * * * *